US007786825B2

(12) United States Patent
Handtmann et al.

(10) Patent No.: US 7,786,825 B2
(45) Date of Patent: Aug. 31, 2010

(54) BULK ACOUSTIC WAVE DEVICE WITH COUPLED RESONATORS

(75) Inventors: Martin Handtmann, Munich (DE); Jyrki Kaitila, Riemerling (DE)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 159 days.

(21) Appl. No.: 11/756,521

(22) Filed: May 31, 2007

(65) Prior Publication Data
US 2008/0297278 A1    Dec. 4, 2008

(51) Int. Cl.
    *H03H 9/58*    (2006.01)
(52) U.S. Cl. ...................................... 333/189
(58) Field of Classification Search ............. 333/133, 333/186–192
See application file for complete search history.

(56) References Cited

U.S. PATENT DOCUMENTS

| 6,720,844 | B1 * | 4/2004 | Lakin .......................... 333/189 |
| 6,917,261 | B2 * | 7/2005 | Unterberger ................. 333/189 |
| 6,963,257 | B2 * | 11/2005 | Ella et al. ..................... 333/133 |
| 7,391,285 | B2 * | 6/2008 | Larson et al. ................ 333/189 |
| 7,391,286 | B2 * | 6/2008 | Jamneala et al. ............ 333/189 |
| 7,436,269 | B2 * | 10/2008 | Wang et al. .................. 333/133 |
| 7,515,018 | B2 * | 4/2009 | Handtmann et al. ......... 333/133 |
| 7,554,427 | B2 * | 6/2009 | Matsumoto et al. ......... 333/187 |
| 7,616,079 | B2 * | 11/2009 | Tikka et al. .................. 333/189 |
| 2004/0046622 | A1 | 3/2004 | Aigner et al. |
| 2004/0257172 | A1 | 12/2004 | Schmidhammer et al. |
| 2006/0119453 | A1 | 6/2006 | Fattinger et al. |
| 2007/0176710 | A1 * | 8/2007 | Jamneala et al. ............ 333/191 |

FOREIGN PATENT DOCUMENTS

| DE | 10150253 | 4/2003 |
| EP | 1 317 797 B1 | 6/2003 |

* cited by examiner

*Primary Examiner*—Vibol Tan
*Assistant Examiner*—Crystal L Hammond

(57) ABSTRACT

A bulk acoustic wave device includes first and second resonators, which are acoustically coupled and electrically connected in parallel.

25 Claims, 14 Drawing Sheets

BULK ACOUSTIC WAVE DEVICE WITH COUPLED RESONATORS

BACKGROUND

The present invention relates to the field of bulk acoustic wave devices.

SUMMARY OF THE INVENTION

Embodiments of the present invention comprise a bulk acoustic wave device with first and second resonators, which are acoustically coupled and electrically connected in parallel.

BRIEF DESCRIPTION OF THE DRAWINGS

Features of embodiments of the invention will be more readily appreciated and better understood by reference to the following detailed description, which should be considered with reference to the accompanying drawings, in which.

Figure 1:
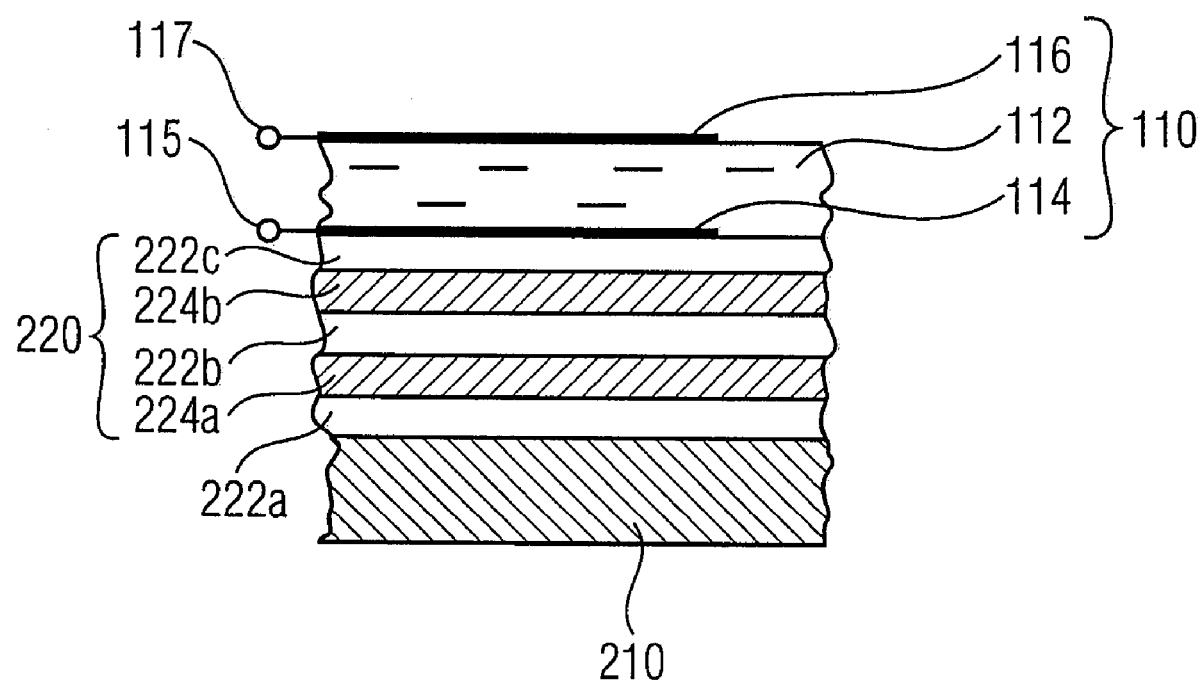
FIG. 1 shows a conventional BAW resonator.

Before embodiments of the present invention will be explained in more detail below with reference to the drawings, it is to be noted that equal elements or those operating in an equal way are provided with the same or similar reference numerals in the figures, and that a repeated description of these elements is omitted.

DETAILED DESCRIPTION OF ILLUSTRATIVE EMBODIMENTS

A bulk acoustic wave (BAW) resonator can be manufactured concurrently with a coupled resonator filter (CRF), which, by itself, is a device performing a filtering function. It suffers, however, from relatively poor transition band performance, which means that the transition bands between the pass band and the stop bands do not fall down within a sufficiently small frequency space. By connecting a ladder filter section in front and/or after the CRF(s), it is possible to make the transition bands steeper. These ladder filter sections can be constructed of BAW resonators comprising (at least) two different resonance frequencies. Conventional filters and especially transmit filters (Tx) exhibit a further issue related to harmonic generation at high power levels.

Conventional filtering devices using either traditional BAW resonators or a modification of the CRF layer stack are known, wherein the BAW resonators employ only a single piezo layer (or piezoelectric layer) and the modified CRF layer stack disable the piezoelectric function of all except one piezo layer (in general, a CRF comprising two or more piezo layers). These conventional methods show, however, drawbacks either in the manufacturing simplicity (for the case using traditional BAW resonators) or in the resulting electrical performance (when using a modified CRF layer stack). In either case, the frequency trimming of the single resonators is difficult involving multiple lithography steps.

The CRF is, however, a promising candidate for mode and/or impedance-converting filters. It offers a smaller size with good electrical performance for a frequency range of 1 to 10 GHz. In a basic configuration, a CRF comprises a first piezoelectric layer sandwiched by two electrodes forming a first resonator element and a second piezoelectric layer sandwiched by two further electrodes forming a second resonator element. These electrodes can be constructed of two (or more) layers comprising materials of different acoustical impedance, and thickness adjustments of the corresponding layers can be done in order to trim the resonance frequency of the corresponding BAW resonator.

A series of coupling layers can be placed between the first resonator element and the second resonator element to provide an acoustical coupling/decoupling between both resonator elements. In general, the coupling layers comprise layers of alternating high and low acoustic impedance materials and the choice for these materials determines the coupling between the first resonator element and the second resonator element. By changing the number of the coupling layers, their composition and/or their thickness, the acoustic coupling layer between the first resonator element and the second resonator element can be tuned to a desired value. When the acoustic coupling comprises the desired value, the resulting CRF device operates in a so-called critical coupled mode exhibiting a wide pass band. This larger filter bandwidth of the resulting resonator comprises a principle benefit of CRFs and is especially enabled by a higher electromechanical coupling coefficient between the resonator elements.

The acoustical isolation from a substrate can be achieved by either creating an air interface on a bottom side of the CRF or by applying an acoustical mirror between the CRF and the substrate. The latter one is also known as a solidly mounted resonator or SMR. The acoustical mirror can be, like the aforementioned coupling layers, composed of alternating high and low acoustic impedance materials providing good reflection of acoustic waves at an attended operation frequency.

The performance of the CRF is good for many applications. However, it suffers from some drawbacks, which especially include rather gently sloping transition bands. The transition bands are defined as the region in the frequency space where the filter changes from a pass band to a stop band. For many applications, such as various GSM or UMTS bands for mobile communications, it is desirable that the filter transfer characteristics change more rapidly between the pass and stop bands.

It is known that, for example, ladder filters are able to provide steep transition band characteristics, wherein the ladder filter can be constructed from simple BAW resonators comprising only a single piezo layer. These BAW resonators come in (at least) two groups, a first group, comprising so-called series resonators with higher resonance frequency and a second group, comprising so-called parallel (shunt) resonators with a lower resonance frequency. By an appropriate connection, they can provide a single-to-single transfer function, as will be shown below.

A combination of a CRF with the ladder filter brings the benefit of steep transition bands and the larger functionality (e.g., a possible mode conversion) of the CRF. One method to achieve this is to realize, maybe on a common substrate, a device combining a traditional BAW resonator with a CRF. This is, however, rather difficult and a more practical method to achieve the goal is to form a resonator from the upper piezoelectric layer of the CRF stack by a slight modification of the underlying layers.

By connecting the two piezo layers of the traditional CRF electrically in a parallel configuration, it is, namely, possible to realize a coupled resonator structure exhibiting only one resonance. In contrast, the traditional CRF shows in essence two resonance frequencies close to each other. The resulting new structure, a resonator in essence, comprises its resonance frequency automatically very close to the frequency of the original CRF. This resonator is in the following also denoted by CRF−R and can be utilized in a combined CRF+CRF−R filter. In addition, the CRF−R, by its very nature, compensates for non-linear piezoelectric effects. Therefore, the harmonic generation in the resulting filter is considerably better than in a traditional device.

Therefore, a bulk acoustic wave device according to embodiments of the present invention comprises a first resonator and a second resonator, wherein the first and second resonators are acoustically coupled and wherein the first and second resonators are electrically connected in parallel. The resulting CRF−R can also be employed as simple ladder type filters on a multi-filter chip.

Therefore, embodiments of the present invention meet the demand for a resonator structure based on a coupled resonator filter layer stack that is easy to manufacture and, moreover, provides superior size and electrical performance when compared to existing solutions and, therefore, the device according to embodiments of the present invention can show superior characteristics with a less consumed chip area.

Thus, embodiments of the present invention are based on the finding that by electrically connecting the two resonators, constituting the CRF, in parallel, a device exhibiting only a single resonance is formed. The layer stack can be designed so that only a single strong resonance for all configurations is observed. Moreover, it is not necessary that the thickness of the various layers is the same in order to achieve desired characteristics.

In more details, embodiments describe a BAW device comprising a first resonator and a second resonator, each comprising a first electrode, a piezoelectric layer formed at least partially on the first electrode, and a second electrode formed at least partially on the piezoelectric layer. The piezoelectric layer of the first resonator and the piezoelectric layer of the second resonator are oriented in a same direction or are oriented in an opposite direction.

With the orientation of the piezoelectric layer, it is referred to a direction along the axis of the crystal of the piezoelectric layer along which the crystal shrinks or expands when an electric field is applied. Depending on the orientation of the electric field (related to the polarization of the voltage applied to electrodes on opposite sides of the crystal), the crystal shrinks or expands and, hence, the two orientations of the piezo layer correspond to the two possibilities (shrinking or expanding) of the crystal, when the electric field is applied.

In further embodiments, the first resonator and the second resonator comprise substantially the same properties, meaning that the layer thickness and the layer extensions are substantially the same. This means that in the case of a complete acoustic decoupling, both resonators would show the same electric properties. In yet further embodiments, the acoustically coupled first and second resonators are formed on a substrate comprising an acoustic mirror, which can be formed by a layer assembly of alternating high and low acoustic impedance materials.

A bulk acoustic wave device according to embodiments of the present invention can furthermore be combined with conventional filters, either within a series connection or a parallel connection with the input or output port of the conventional filters. Thus, embodiments provide also a filter, comprising a first stage and a second stage, wherein at least one of the first stage and the second stage comprises a bulk acoustic wave device. The bulk acoustic wave device comprises the first resonator and the second resonator, wherein the first and second resonators are acoustically coupled, and wherein the first and second resonators are electrically connected in parallel.

Resonators (CRF−R) according to embodiments of the present invention can be used to construct filters, such as ladder or lattice type filters. In practice, resonators exhibiting at least two resonance frequencies, one for series and one for shunt (parallel) resonators, are needed. Therefore, there is a need for a method to shift the resonance frequency of one of the groups of resonators. This can be, for example, achieved by either depositing a mass-load layer at some point in the layer stack of the shunt resonators or by subtracting a layer (or removing a portion of a layer) from the series resonators. The corresponding detuning by layer thickness adjustments can be done, for example, with respect to electrode layers, which in general change the resonance frequency. Many conventional methods for ordinary BAW resonators can do this and they can be more or less directly applied in the current case. This highlights one of the benefits of embodiments of the present invention. Since the two resonators constituting the CRF are acoustically coupled (besides the electrical coupling achieved by the series connection), a shifting of the resonance frequency of one of them automatically also shifts the resonance frequency of the other. Both of these resonance shifts are almost equal for small changes in the layer stack and the single resonance characteristics of the device are retained. This is an important point for manufacturing a filter with pure pass band characteristics.

The CRF−Rs show important electrical properties. The piezoelectric orientations of both piezoelectric layers can be connected in an anti-parallel configuration with respect to the two input terminals of the CRF−R. This means that one orientation of the piezoelectric layer can be directed towards the input terminal, for example, and the orientation of the other piezoelectric layer is directed away from the input terminal, for example (or equivalently with respect to the output terminal). This means that they will vibrate in an anti-phase mode, which is related to a phase shift of 180°, so that in case one of the piezo layers contract, the other expands. This implies an important consequence in the higher power level operation of the proposed device in accordance to embodiments of the invention. It is known that the non-linear piezoelectric effect, which is most pronounced at higher power levels, produces harmonics in the electric characteristics of a traditional BAW device and in the proposed device (CRF−R), the harmonics generated in the upper and lower resonator match each other, however, in anti-phase mode and no, or very little, harmonics are observed in the electrical performance of the device. This has major benefits in transmit filters (Tx filters), where high power levels are typically encountered.

Another benefit of the embodiments of the present invention also regards the size of the CRF-R. The device can be considered as two traditional resonators in series and, therefore, the area consumed by the CRF-R is only half of what would be consumed by a single traditional BAW resonator for a given impedance level. In the case where two cascading traditional BAW resonators in series are wanted in order to cancel the harmonics, the area advantage of the CRF-R is further increased to a factor of 4.

Finally, an important improvement is manufacturing simplicity. For example, a manufacturing of conventional devices on a common substrate implies an important obstacle. In the case of SMR, the manufacturing process of both of these devices is identical up to the top most layers of the mirror structure. However, when the traditional resonator needs to be formed, a method to remove the portions constituting the coupling layers of the device needs to be devised. In addition, the other resonator (either the upper or lower in the CRF stack) needs to be removed. All this adds up to a designing of various edging schemes for various materials. The BAW devices, however, are sensitive to things such as surface roughness, and it can be anticipated that the resulting device would not exhibit good Q-values after these manufacturing steps. Therefore, utilizing the CRF-R according to embodiments of the present invention in combination with the CRF on a common substrate has definite benefits regarding manufacturing simplicity and performance of the resulting hybrid filter.

Embodiments of the present invention are therefore advantageous with respect to conventional filters due to their superior characteristics with a less consumed chip area, with respect to harmonic generations in the resulting filters, which are considerably better. Hence, they are easier to manufacture and provide a superior size and electrical performance when compared to conventional solutions.

Possible materials for layers with high acoustic impedance comprise, for example: W, Mo, Pt, Ta, TiW, TiN, Ir, WSi, Au, $Al_2O_3$, SiN, $Ta_2O_5$ and Zirkon-oxide, wherein the last four are dielectric materials. Possible materials for the piezoelectric layers are, for example, AlN, ZnO, PZT and $LiNbO_3$. A material for lower acoustic impedance is, for example, aluminum.

FIG. 1 shows a conventional BAW resonator with a piezoelectric layer 112, a first electrode 114 with a first terminal 115 and a second electrode 116 with a second terminal 117. The first electrode 114 and the second electrode 116 are formed, at least partially, on two opposite sides of the piezoelectric layer 112. The BAW resonator shown in FIG. 1 is a so-called solidly mounted resonator (SMR), which implies that the resonator 110 is formed on a substrate 210 with an acoustic mirror 220, wherein the acoustic mirror 220 comprises a layer assembly. The layer assembly comprises layers of alternating higher and lower acoustic impedances, so that a first layer of low acoustic impedance 222a is formed on the substrate 210, a first layer of high acoustic impedance 224a is formed on the layer with low acoustic impedance 222a, followed by a second layer of low acoustic impedance 222b, followed by a second layer of high acoustic impedance 224b and, finally, followed by a third layer of low acoustic impedance 222c.

Figure 2:
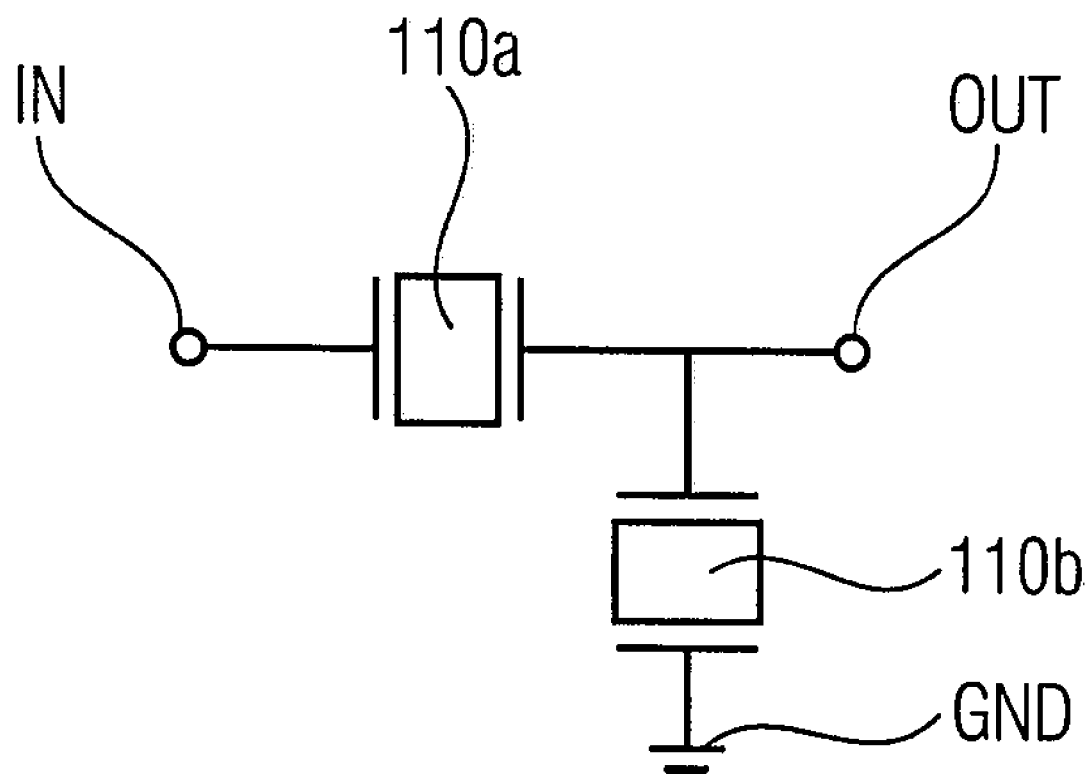
FIG. 2 shows a single section ladder filter formed by BAW resonators.

FIG. 2 shows a single section of a ladder filter formed by two BAW resonators, a first resonator 110a and a second resonator 110b. The first resonator 110a is connected between an in-terminal and an out-terminal, and the second resonator 110b connects the out-terminal to ground (Gnd). In further embodiments, this single section of the ladder filter is repeated, for example, by connecting the out-terminal of the single section, as shown in FIG. 2, by a further in-terminal of a further section of the ladder filter. A finally arranged ladder filter may, therefore, comprise several sections, each one structured as shown in FIG. 2.

Figure 3:
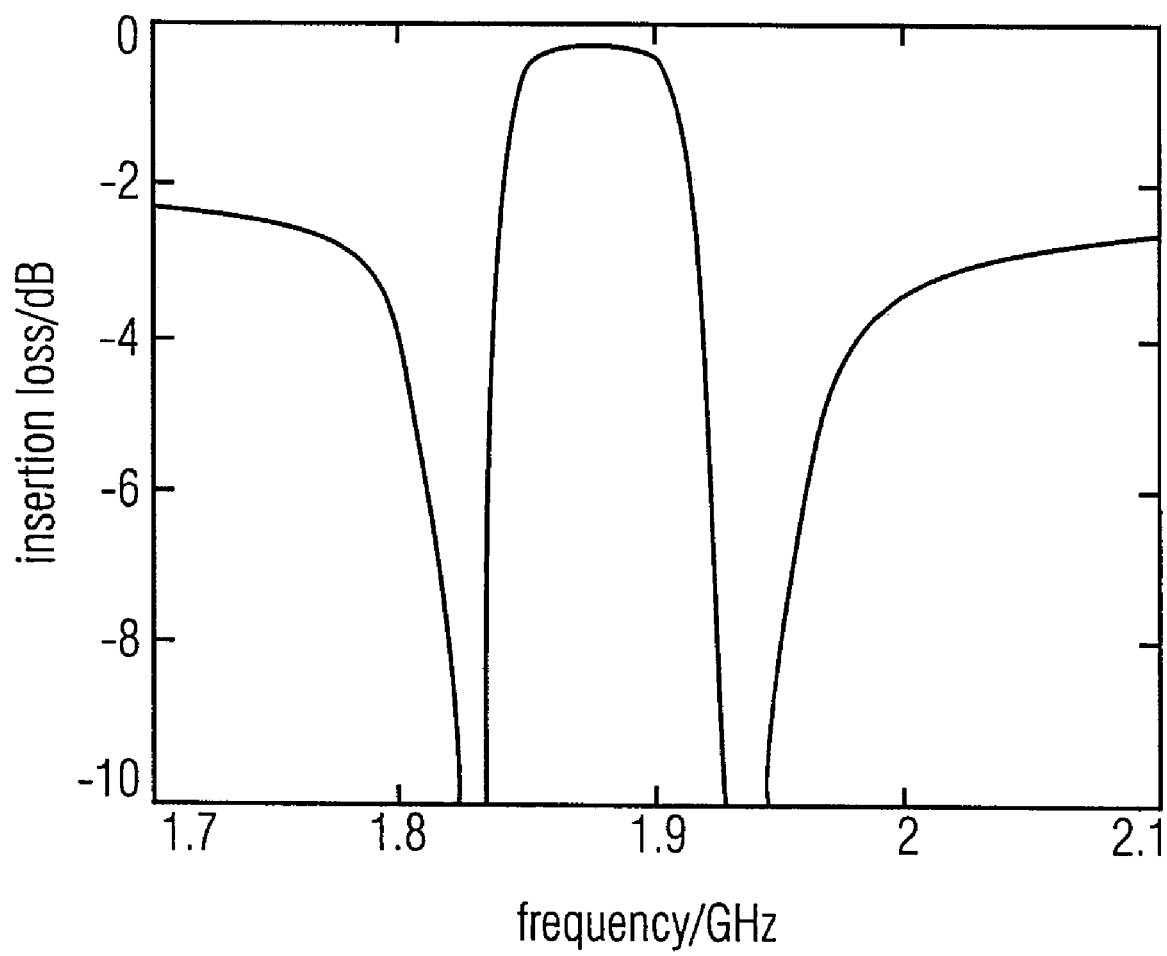
FIG. 3 shows a passband response of a one section ladder filter.

FIG. 3 shows a passband response characteristic of the single section of the ladder filter. An insertion loss signal (measured in dB) is shown here as a function of the frequency, as measured in GHz. The insertion loss measures, for example, the energy loss of a signal passing a filter, which in this example, is the ladder filter. Since the insertion loss signal measures an attenuation, a zero-value corresponds to a signal passing the filter without loss. The graph shows that around a central frequency of about 1.89 GHz, the insertion loss exhibits a maximum, around which the signal exhibits almost no loss. This maximum has a certain width, which approximately extends from 1.85 GHz to 1.92 GHz and outside this region the graph falls rapidly to minima, which are at about 1.84 GHz and at about 1.94 GHz. For frequencies below 1.84 GHz and for frequencies above 1.94 GHz, the graph, again, increases monotonically. This graph shows the characteristics for a single section, whereas multiple sections achieve a desired stop band performance typically by a cascading behavior.

Figure 4A:
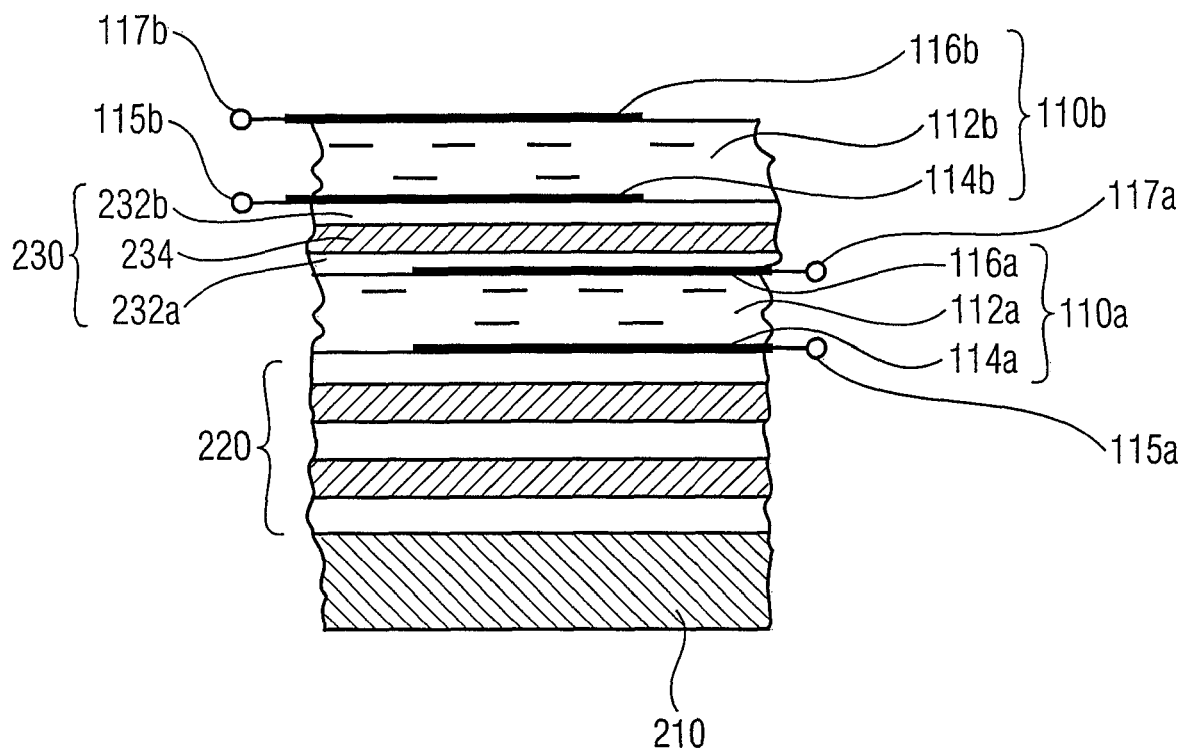
FIGS. 4a and 4b show a cross sectional view of a coupled resonator filter and its passband characteristic.
Figure 4B:
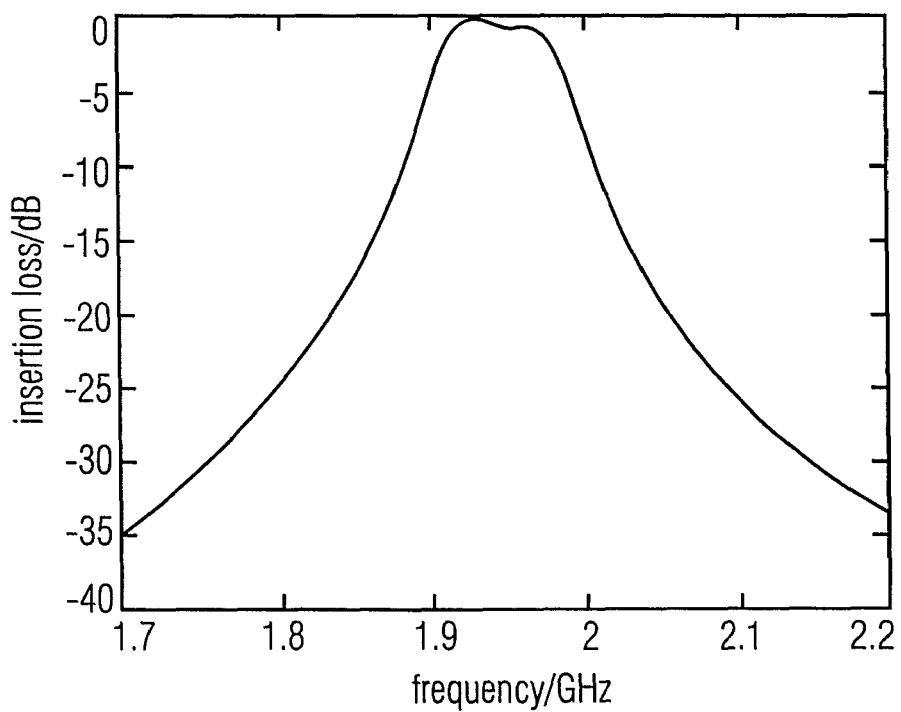

FIG. 4 shows a coupled resonator filter comprising a layer arrangement as shown in FIG. 4a and its corresponding characteristic, as shown in FIG. 4b. The CRF comprises first and second resonators 110a, 110b, wherein each resonator comprises a first piezoelectric layer 112a, 112b between a first electrode 114a, 114b and a second electrode 116a, 116b. The first resonator 110a and the second resonator 110b are formed on two opposite sides of a coupling layer 230, which may comprise an assembly of layers of alternating high and low acoustic impedances. As an example, a coupling layer of low acoustic impedance 232a is formed at least partially on the first resonator 110a, on which a coupling layer of high acoustic impedance 234 is formed at least partially, on which a second coupling layer of low acoustic impedance 232b is formed at least partially, on which the first electrode 114b of the second resonator 110b is formed at least partially followed by the piezoelectric layer 112b of the second resonator 110b and the second electrode 116b of the second resonator 110b. The first electrodes 114a, 114b can, again, comprise first terminals 115a, 115b, and the second electrodes 116a, 116b may comprise second terminals 117a, 117b. The CRF can, again, be arranged as a solidly mounted resonator implying that the CRF is formed on a substrate 210 with an acoustic mirror 220. Again, the acoustic mirror 220 has been described in more detail in the context of FIG. 1 and a repeated description is omitted here.

The transfer characteristics of the CRF, as shown in FIG. 4a, is displayed in FIG. 4b, where an insertion loss (measured, again, in dB) is shown as a function of the frequency as measured in GHz. Starting with low frequencies, the insertion loss is a monotonic increasing function up to a maximum at around 1.93 GHz and a second maximum at around 1.96 GHz. For higher frequencies, the insertion loss is a monotonically decreasing function and the insertion loss remains almost constant between the two maximums (apart from a small minimum at around 1.94 GHz). FIG. 4b shows that the CRF exhibits a wide passband behavior, wherein the width of the passband (corresponding to the separation of the two maximums) may be arranged appropriately by the coupling layer 230 between the first resonator 110a and the second resonator 110b. The central frequency of this bandpass on the other hand, which is at around 1.94 GHz, may be adapted, for example, by choosing the resonant frequency of the first resonator 110a (e.g., by modifying the thickness of its piezoelectric layer 112a accordingly).

Figure 5A:
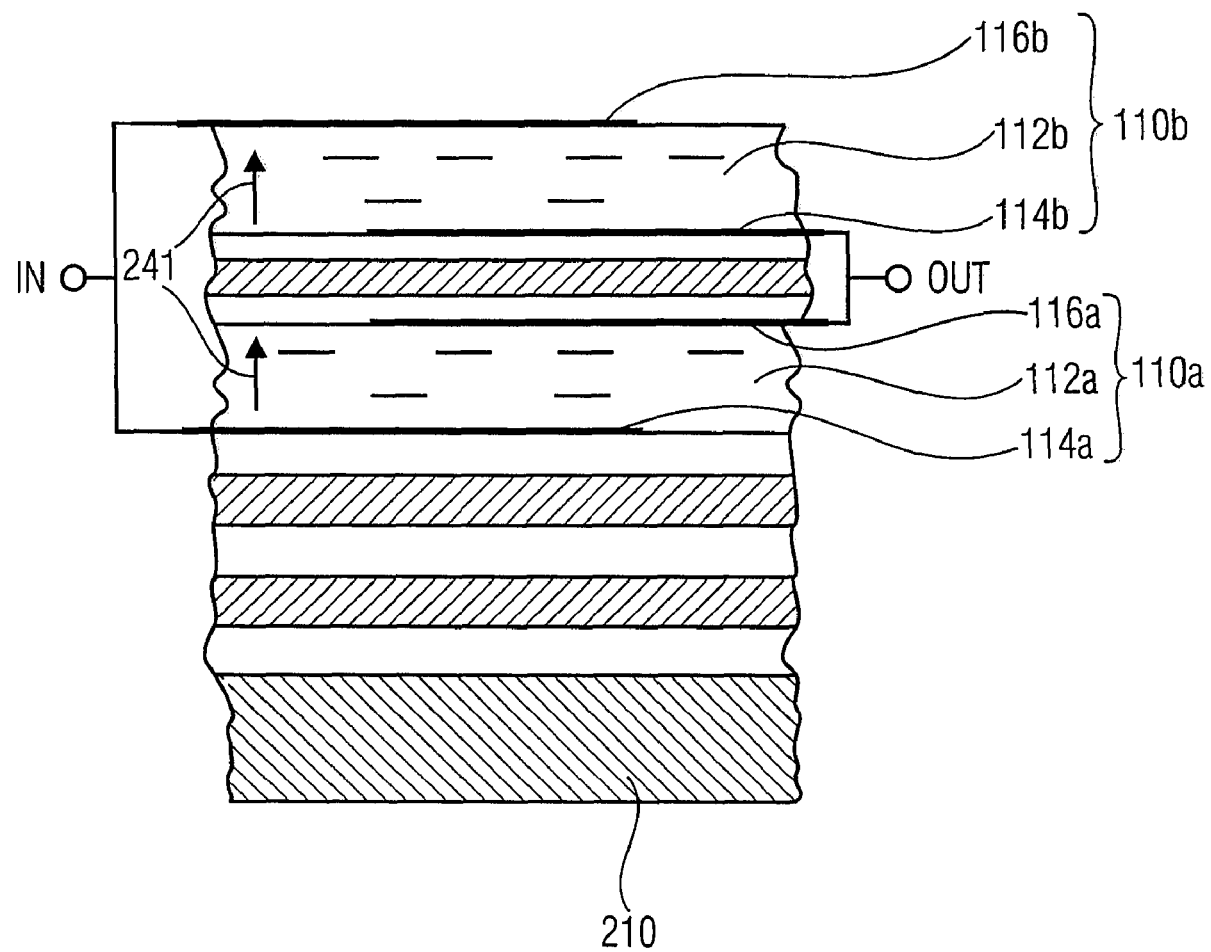
FIGS. 5a and 5b show an electrical connection of the coupled resonator according to embodiments of the present invention.

FIG. 5a shows a first embodiment of the present invention, which comprises the coupled resonator filter as shown in FIG. 4a, wherein the first electrode 114a of the first resonator 110a and the second electrode 116b of the second resonator 110b are connected to a first terminal (In), and wherein the second electrode 116a of the first resonator 110a and the first electrode 114b of the second resonator 110b are connected to a second terminal (Out).

In the embodiment as shown in FIG. 5a, the piezoelectric layer 112a of the first resonator 110a and the piezoelectric layer 112b of the second resonator 110b are oriented in the same direction as indicated by the arrows 241. The aligned directions 241 in this embodiment face off the substrate 210 or face off the first electrode 114a of the first resonator 110a and face towards the second electrode 116b of the second resonator 110b.

Figure 5B:
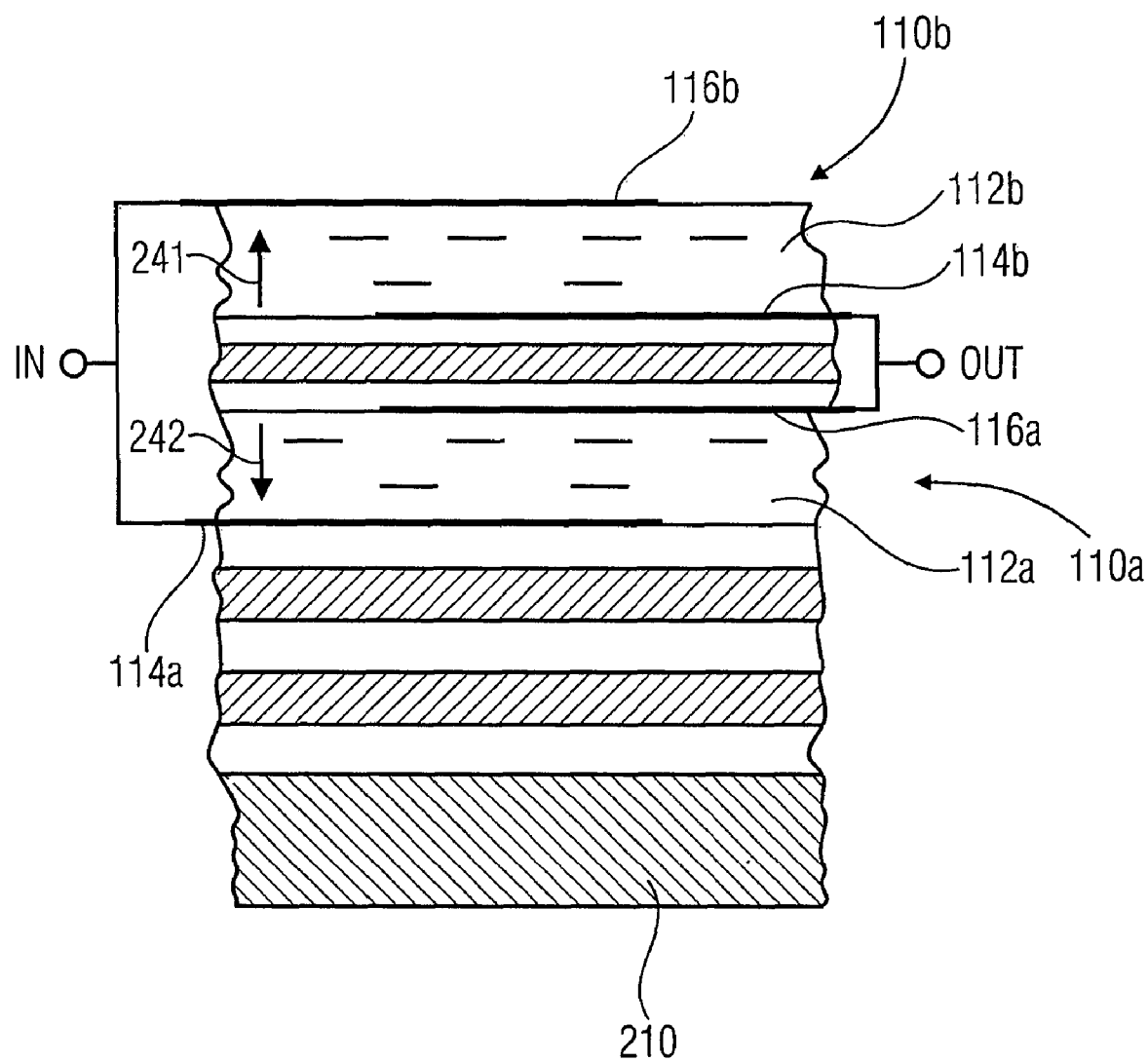

The embodiment as shown in FIG. 5b differs from the one shown in FIG. 5a by a flipped (or opposite) orientation of the piezoelectric layer 112a of first resonator 110a. One orientation of the piezoelectric layer can be directed towards the input terminal—in FIG. 5a the orientation of the piezoelectric layer 112b of the second resonator 110b—and the orientation of the other piezoelectric layer—the orientation of the piezoelectric layer 112a of the first resonator 110a in FIG. 5a—is directed away from the input terminal, for example (or equivalently with respect to the output terminal). Hence, the orientation of the piezoelectric layer 112a of the first resonator 110a and the orientation of the piezoelectric layer 112b of the second resonator 110b are oriented in opposite directions as indicated by the two arrows 241 and 242. Again, the two anti-parallel directions 241 and 242 are perpendicular to a surface of the substrate 210. In further embodiments, the orientation of the piezoelectric layer 112b of the second resonator 110b can be directed towards the substrate and the orientation of the piezoelectric layer 112a of the first resonator 110a can be directed away from the substrate 210.

Figure 6A:
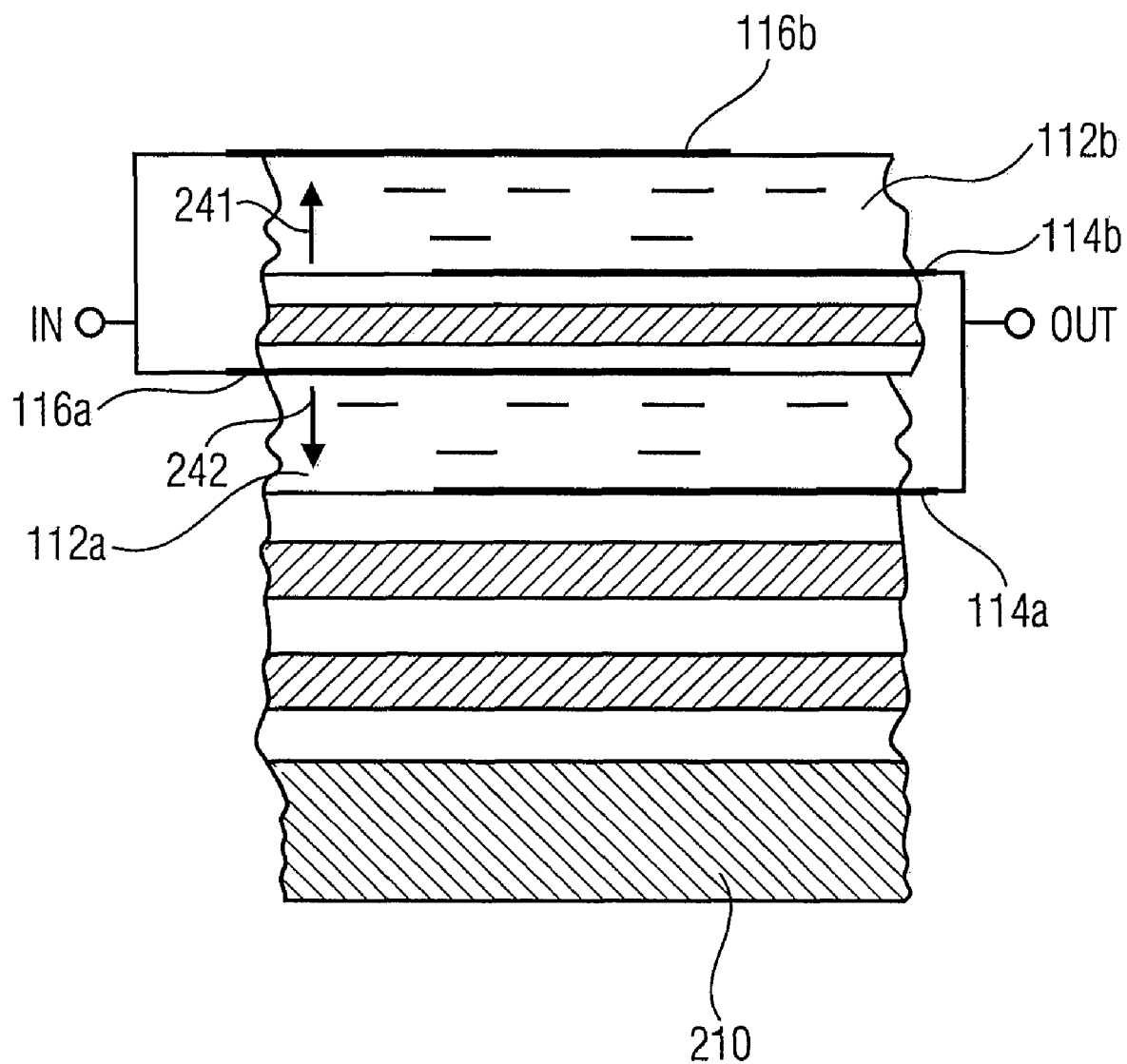
FIGS. 6a and 6b show an electrical connection of the coupled resonator filter according to further embodiments of the present invention.
Figure 6B:
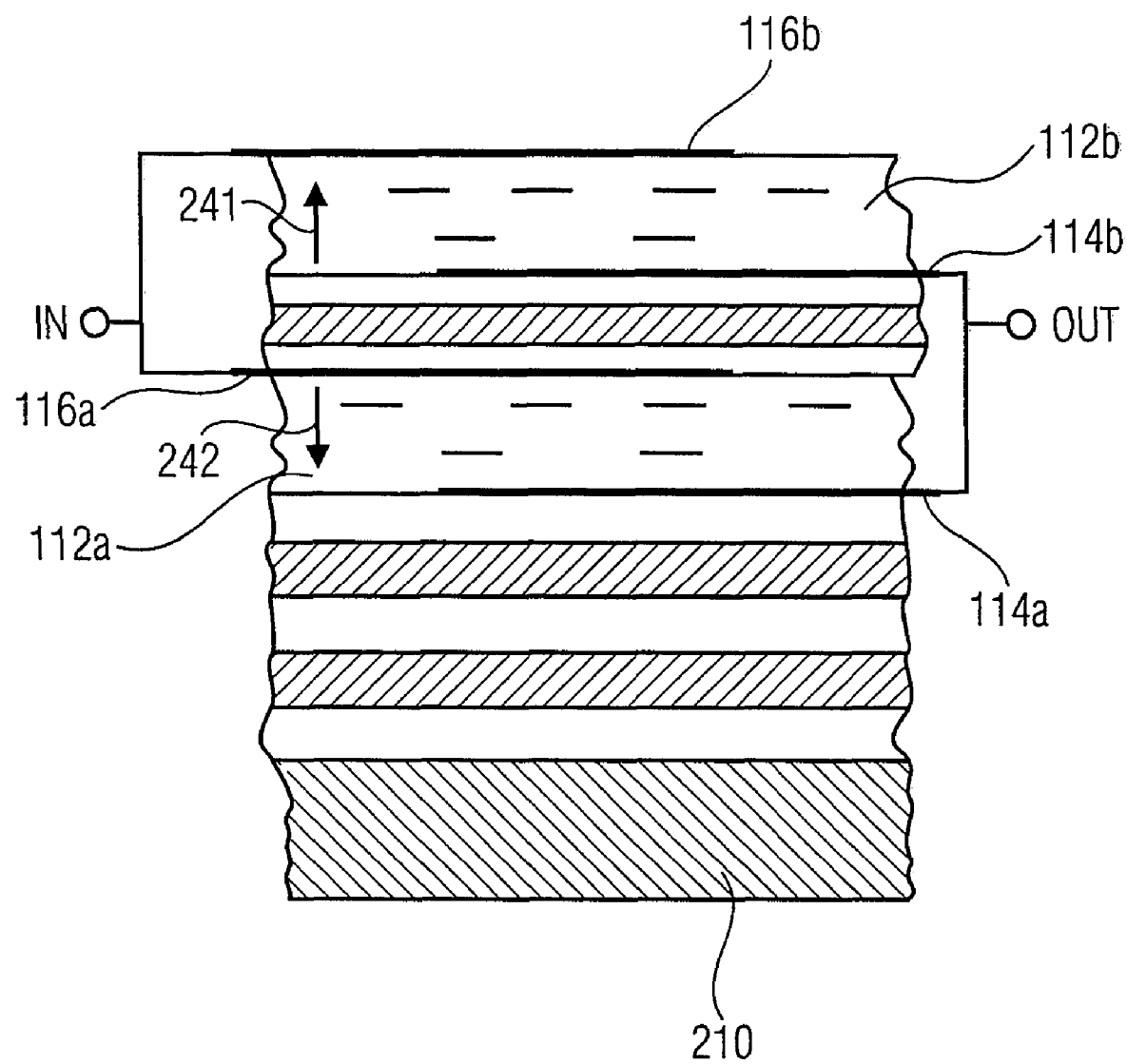

FIGS. 6a and 6b show further embodiments of the present invention, in which the first resonator 110a and the second resonator 110b are connected in the following way. The second electrode 116a of the first resonator 110a and the second electrode 116b of the second resonator 110b are connected to a first terminal (In) and the first electrode 114a of the first resonator 110a and the first electrode 114b of the second resonator 110b are connected to a second terminal (Out).

The difference in the embodiments as shown in FIGS. 6a and 6b is the same as the differences between FIGS. 5a and 5b. Again, FIG. 6a shows an embodiment where the orientation of the piezoelectric layer 112a of the first resonator 110a and the orientation of the piezoelectric layer 112b of the second resonator 110b are in opposite directions (anti-parallel), whereas in FIG. 6b, an embodiment is shown where the orientation of the piezoelectric layer 112a of the first resonator 110a coincides with the orientation of the piezoelectric layer 112b of the second resonator 110b (parallel orientation). The choice of the orientation as indicated by the arrows 241 and 242 are only examples and in additional embodiments these orientations can be chosen differently—e.g. the orientation 241 facing towards and the orientation 242 facing off the substrate 210—as long as the orientations are parallel or anti-parallel.

Summarizing the embodiments, FIGS. 5a and 6b show an electrical connection of the CRF-R, wherein both piezoelectric layers (the piezoelectric layer 112a of the first resonator 110a and the piezoelectric layer 112b of the second resonator 110b) are oriented in the direction of the arrows 141. On the other hand, a possible configuration comprising an anti-parallel piezo-layer orientation as indicated by the two arrows 241 and 242 is shown in FIGS. 5b and 6a. Thus, both piezoelectric layers are oriented in the same or opposite directions, but the directions 141, 142 do need not to be the one shown in FIGS. 5a to 6b and, in further embodiments, the orientation of the piezoelectric layers 112a, 112b can exhibit a certain angle with the surface of the underlying substrate or with the electrodes and is not necessarily to be perpendicular as shown in FIGS. 5a to 6b.

Figure 7:
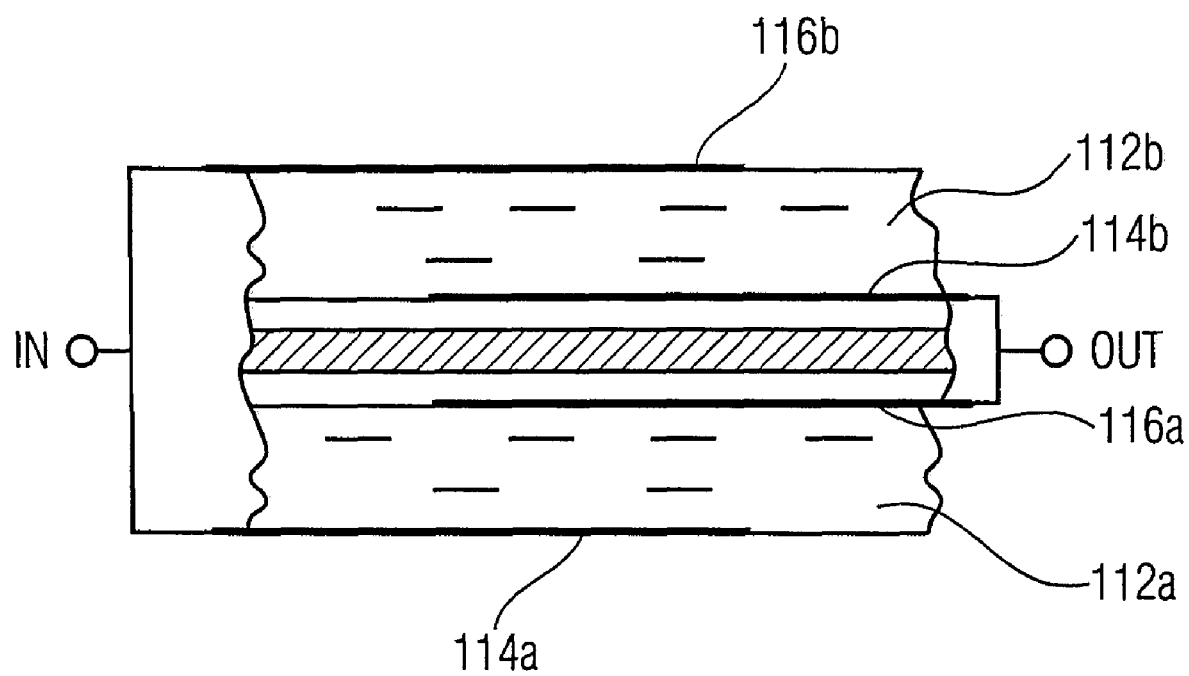
FIG. 7 shows an electrical connection of the coupled resonator filter for a membrane device.

FIG. 7 shows an embodiment, wherein the device is not solidly mounted on the substrate 210 (with an acoustic mirror 220), as shown in FIGS. 5a to 6b, but is instead designed as a membrane device comprising air interfaces on both sides of the structure. The membrane device from FIG. 7 comprises the same components as the coupled resonator as shown in FIG. 4a, however without the acoustic mirror 220 and the substrate 210. In the embodiment in FIG. 7, the electrodes are again connected as the embodiments of FIGS. 5a and 5b, so that the first electrode 114a of the first resonator 110a and the second electrode 116b of the second resonator 110b are connected to a first terminal (In) and the second electrode 116a of the first resonator 110a and the first electrode 114b of the second resonator 110b are connected to a second terminal (Out). The orientation of both piezoelectric layers 112a and 112b can be again oriented parallel or anti-parallel (as in FIGS. 5a and 5b). In the same way also for the embodiments as shown in the FIGS. 6a and 6b, a corresponding membrane device can be realized, so that the substrate 210 and the acoustic mirror 220 in FIGS. 6a and 6b are absent in the membrane device.

Optionally, the device as shown in FIG. 7 can be arranged on a layer (not shown in FIG. 7) in order to provide a sufficient mechanical framework, which holds the device. This additional layer should be chosen in a way that it does not (or only to a very low level) couple acoustically to the membrane device and fulfils only the purpose to provide mechanical stability to the membrane device. Such membrane devices can be realized either by using surface micro machining from a front side of the wafer or through bulk micro machining through the backside of the wafer. Persons skilled in the art know the corresponding methods.

Figure 8A:
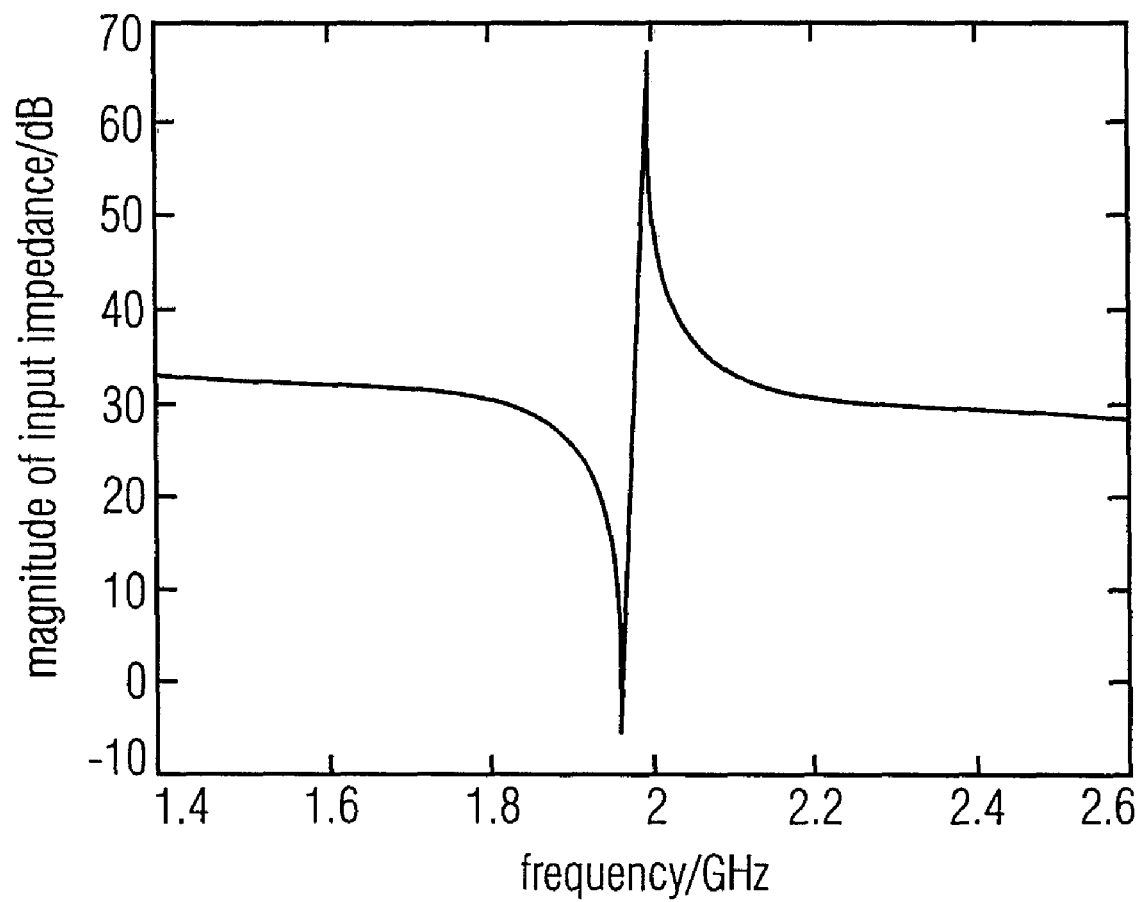
FIGS. 8a and 8b show graphs for the input impedances for the embodiments shown in FIGS. 5 and 6.
Figure 8B:
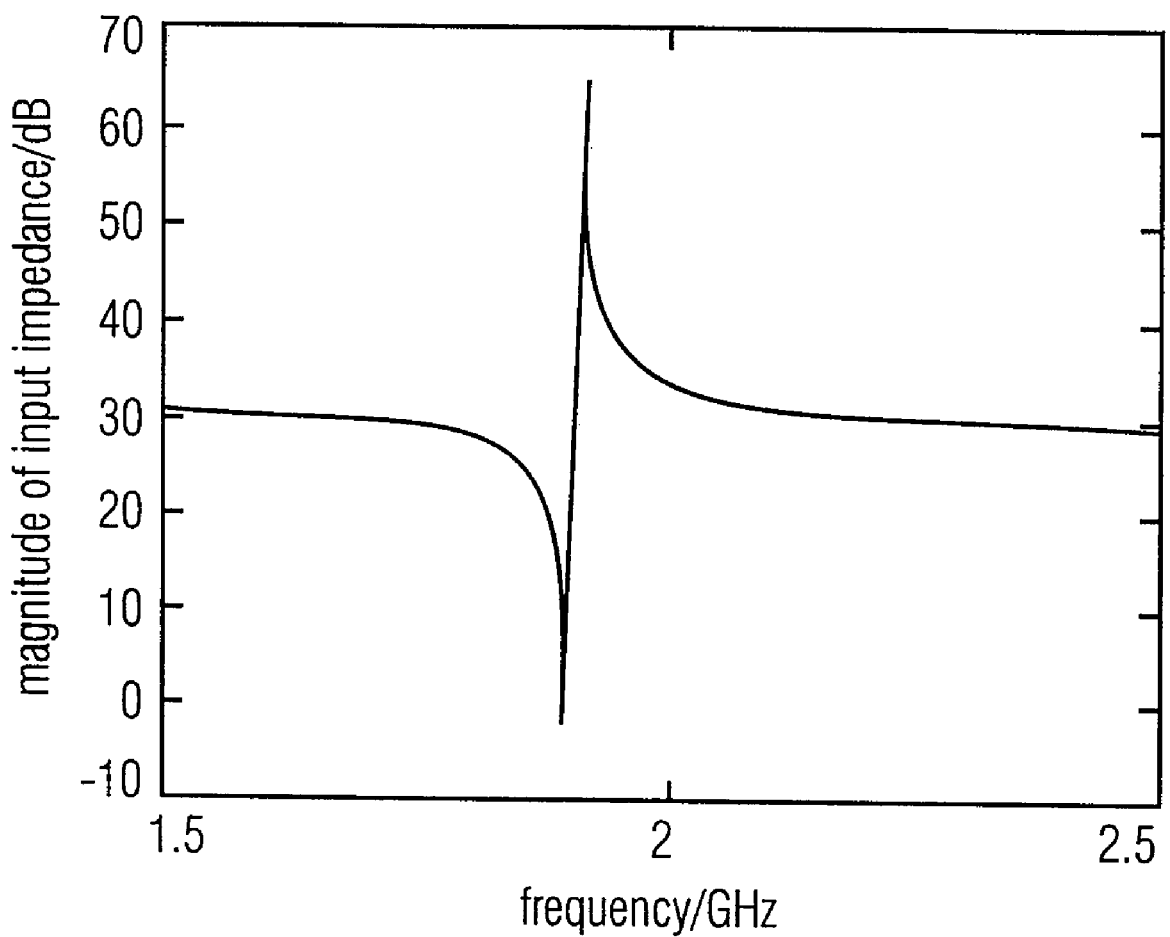

FIGS. 8a and 8b show graphs for the input impedances for the bulk acoustic wave devices as shown in FIGS. 5a-6b. FIG. 8a shows the electric characteristic of the devices as shown in FIGS. 5a and 6a (the lower resonator is reversibly configured) and FIG. 8b shows the electric characteristic of the devices as shown in FIGS. 5b and 6b. FIG. 8a shows a graph for the magnitude of the input impedance as function of the frequency (measured in GHz) and shows a resonance peak at approximately 1.96 GHz. For frequencies below this peak, the magnitude of the input impedance decreases toward the resonance frequency. For frequencies above the resonance frequency, the magnitude of the input impedance decreases toward higher frequencies.

FIG. 8b shows a graph for a magnitude of the input impedance, again as a function of the frequency as measured in GHz. The graph as shown in FIG. 8b exhibits an equivalent behavior to the graph as shown in FIG. 8a. In order to achieve the characteristics as shown in FIGS. 8a and 8b, it is not necessary that the thickness of the various layers of the coupled resonators as shown in FIGS. 5a, 5b and 6a and 6b are of the same order.

Figure 9:
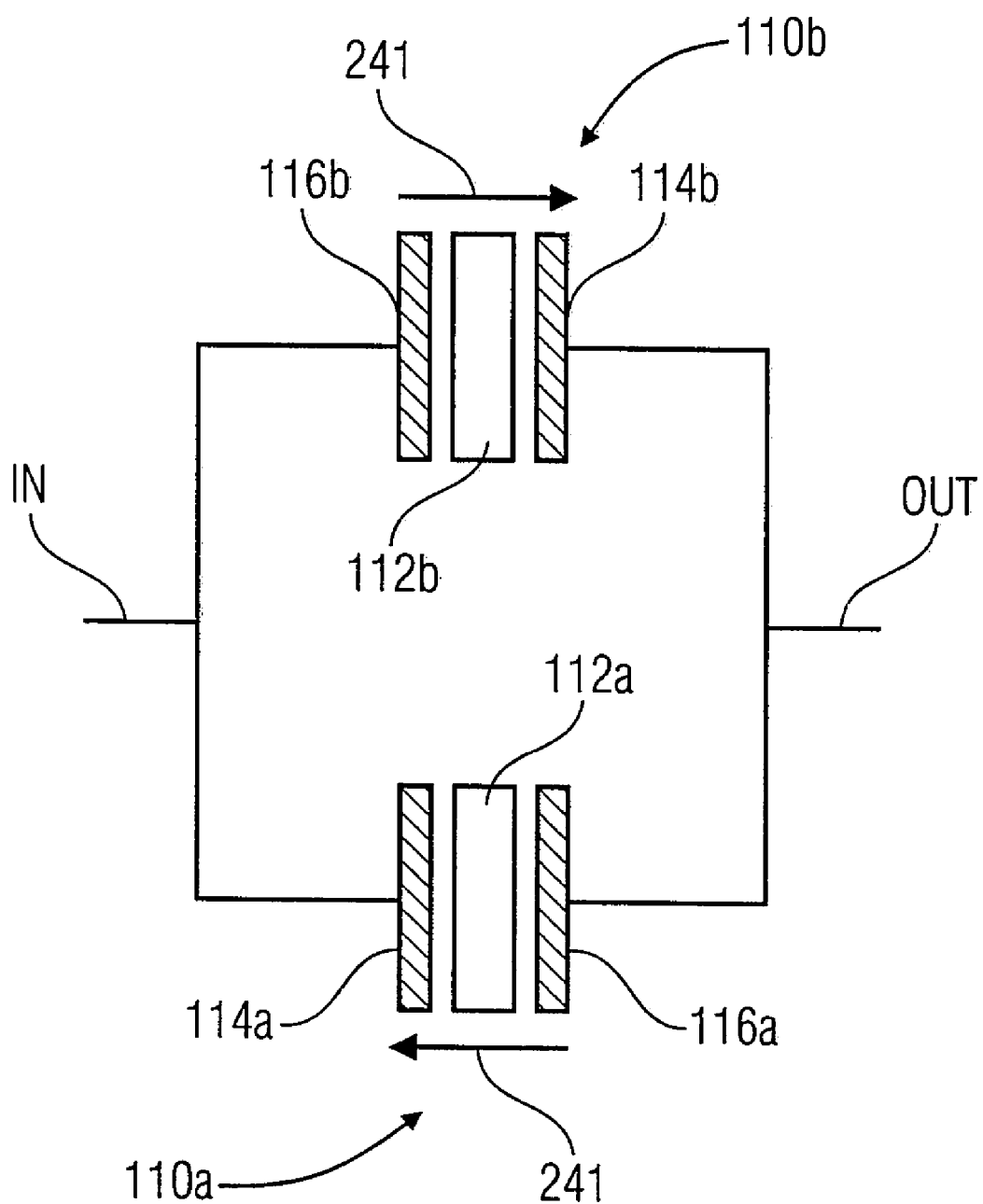
FIG. 9 shows an anti-parallel configuration with respect to the piezoelectric layer orientations of two BAW resonators.

FIG. 9 shows an anti-parallel configuration with respect to the piezoelectric layer 112a of the first resonator 110a and the piezoelectric layer 112b of the second resonator 110b. The presentation of FIG. 9 is such that, for clarity, the two acoustically connected or coupled resonators, the first resonator 110a and the second resonator 110b are separated into two separate entities. In this separating view, the In-terminal is connected to the second electrode 116b of the second resonator 110b and to the first electrode 114a of the first resonator 110a. The out-terminal is connected to the first electrode 114b of the second resonator 110b and to the second electrode 116a of the first resonator 110a. In comparison to the embodiments as shown in FIG. 5a, the orientations of both piezoelectric layers 112a and 112b are reversed which, in other embodiments, is not the case. Although the orientation in FIG. 5a is parallel, in the way FIG. 9 is drawn, the orientation appears anti-parallel. In contrast to FIG. 5a, FIG. 9 shows the circuitry and not the relative (geometric) position or placements of the resonators. Again, a concrete choice for the orientations can be different as long as they are parallel or anti-parallel (at least to an accuracy of +/−10%).

The embodiments as shown in FIG. 6a can also be presented in this way—with the only difference being that the in-terminal is connected to the second electrode 116a of the first resonator 110a and the out-terminal is connected to the first electrode 114a of the first resonator 110a. The embodiments as shown in FIGS. 5b and 6b can also be drawn in this way; however, one orientation of one of the piezo layers has to be flipped, meaning they now appear in a parallel configuration when presented in this way.

Figure 10:
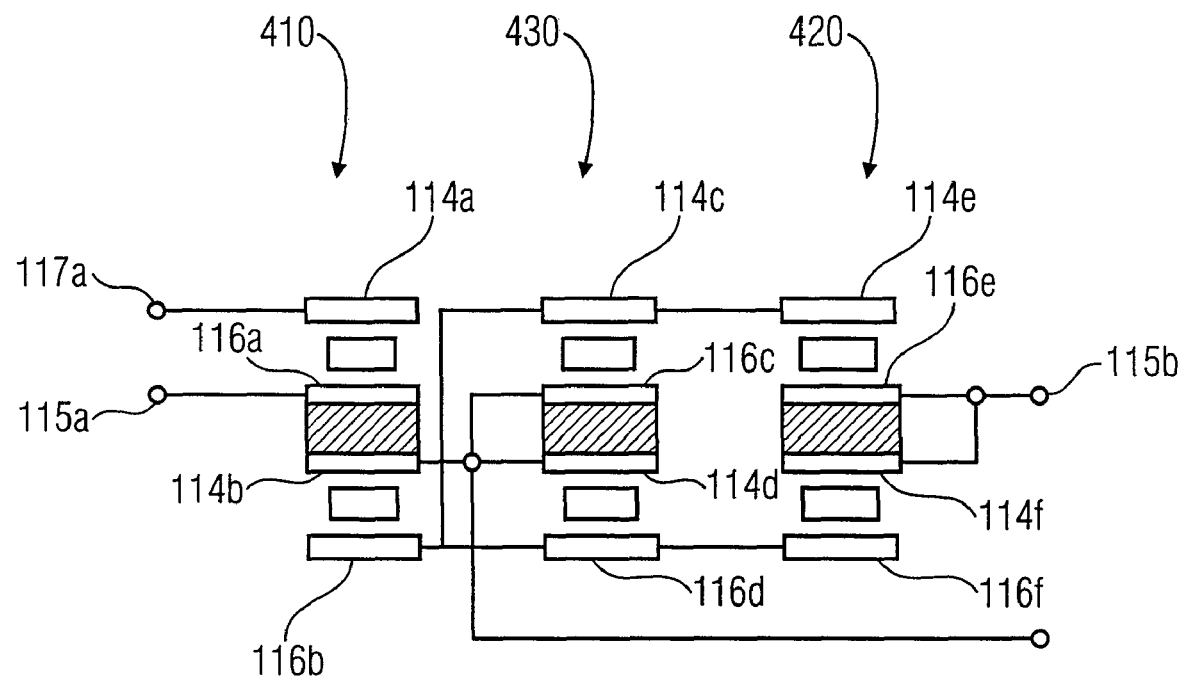
FIG. 10 shows a coupled resonator filter with a shunt stage and a series stage according to embodiments.

FIG. 10 shows an exemplary circuit employing the CRF-R and a CRF. The filter comprises a series connection of a coupled resonator filter 410 and a bulk acoustic wave device 420 and a shunt stage comprising a further bulk acoustic wave device 430. The coupled resonator filter 410 comprises a first resonator and a second resonator, wherein the first and second resonators are coupled and each of the bulk acoustic wave device 420 and the further bulk acoustic wave device 430 comprises a first resonator and a second resonator, which are acoustically coupled and electrically connected in parallel.

The filter comprises moreover a first port and a second port, wherein a first electrode of the first resonator 110a of the coupled resonator filter 410 is connected to a first terminal 117a of the first port, and a second electrode 116a of the first resonator 110a of the coupled resonator filter 410 is connected to a second terminal 115a of the first port. The first electrode 114b of the second resonator 110b of the coupled resonator filter 410 is connected to a second electrode 116a of the first resonator 110a and to a first electrode 116c of the second resonator 110b of the further bulk acoustic wave device 420, and a second electrode 116b of the second resonator 110b of the coupled resonator filter 420 is connected to a first electrode 114c of the first resonator 110a and to a second electrode 116d of the second resonator 110b of the further bulk acoustic wave device 430. The first electrode 114c of the first resonator 110a of the further bulk acoustic wave device 430 is connected to a first electrode 114e of the first resonator 110a of the bulk acoustic wave device 420, and the second electrode 116d of the second resonator 110b of the further bulk acoustic wave device 430 is connected to a second electrode 116f of the second resonator 110b of the bulk acoustic wave device 420. The second electrode 116e of the first resonator 110a and the first electrode 114f of the second resonator 110b of the bulk acoustic wave device 420 are connected to a first terminal 115b of the second port. The second electrode 116c of the first resonator 110a and the first electrode 114d of the second resonator 110b of the further bulk acoustic wave device 430 are connected to a second terminal 117b of the second port.

Figure 11:
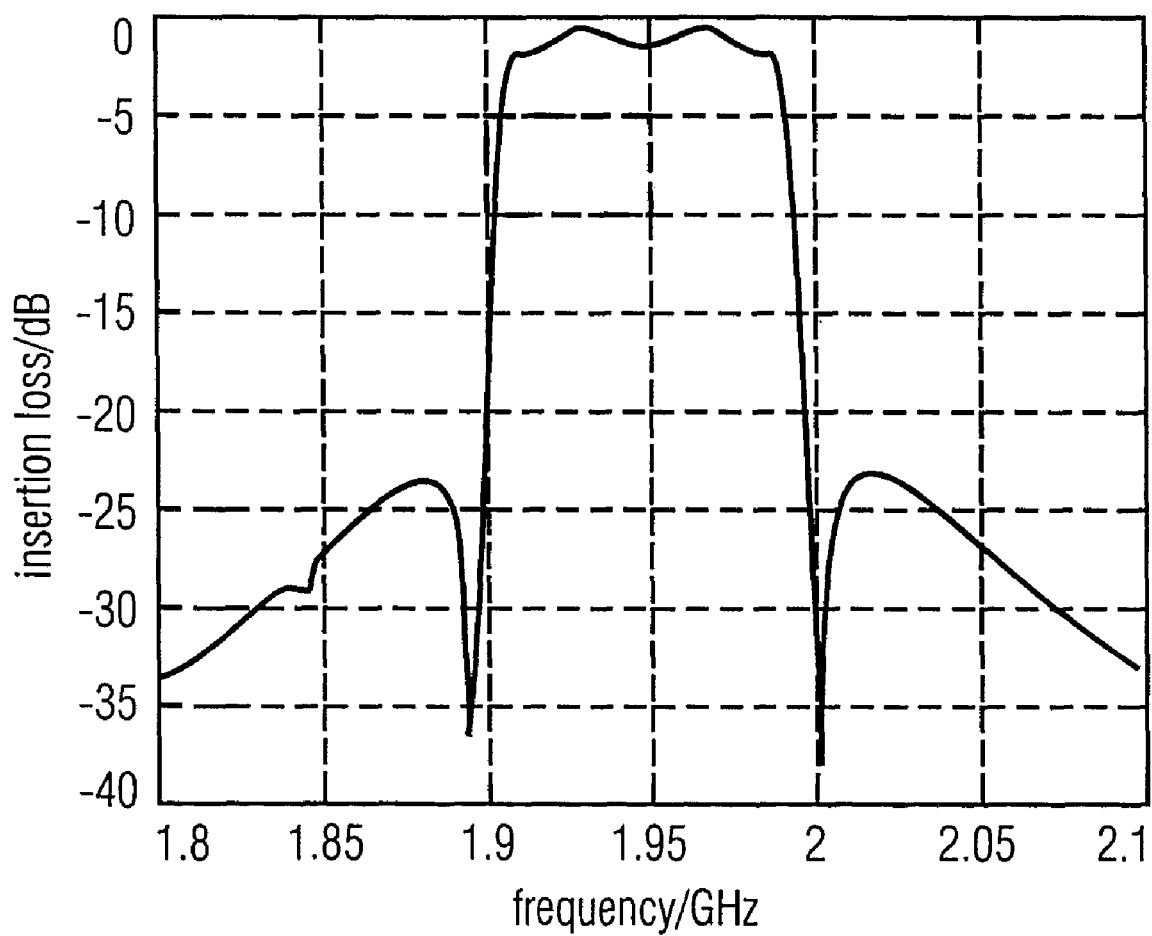
FIG. 11 shows a graph for an insertion loss signal for the configuration as shown in FIG. 10.

FIG. 11 shows a characteristic of the filter according to the embodiment as shown in FIG. 10 and especially the insertion loss signal (measured in dB) as a function of the frequency (measured in GHz). The characteristic shows a pass band in the frequency region between approximately 1.91 and 1.99 GHz. At this frequency region, the transition bands start and the graph in FIG. 11 shows a very steep fall-down—an important benefit of embodiments of the present invention. In the pass band, there is almost no insertion loss (attenuation is almost zero), so that it exhibits very good filter characteristics.

The hybrid filter as shown in FIG. 10 with the characteristic as shown in FIG. 11 is only one exemplary possibility for using bulk acoustic wave devices according to embodiments of the present invention and other circuits, which have not been described, can exhibit the same benefits, which are detailed and described here.

What is claimed is:

1. A bulk acoustic wave device, comprising:
   a first resonator and a second resonator, each of the first and second resonators comprising: a first electrode; a piezoelectric layer disposed over at least a portion of the first electrode; and a second electrode disposed over at least a portion of the piezoelectric layer, wherein the first and second resonators are acoustically coupled, and the first and second resonators are electrically connected in parallel; and
   a coupling layer disposed between the first resonator and the second resonator, the coupling layer comprising a plurality of layers of alternating high and low acoustic impedances for acoustically coupling the first and second resonators, wherein the first electrode of the first resonator and the second electrode of the second resonator are connected, and the second electrode of the first resonator and the first electrode of the second resonator are connected.

2. The bulk acoustic wave device according to claim 1, wherein the piezoelectric layer of the first resonator and the piezoelectric layer of the second resonator are oriented in a same direction or are oriented in opposite directions.

3. The bulk acoustic wave device according to claim 1, wherein the first resonator and the second resonator comprise substantially same properties.

4. The bulk acoustic wave device according to claim 1, further comprising a substrate comprising an acoustic mirror or a membrane region on which the first resonator and the second resonator are formed.

5. The bulk acoustic wave device according to claim 4, wherein the substrate comprises an acoustic mirror, the acoustic mirror comprising a plurality of layers of alternating high and low acoustic impedances.

6. The bulk acoustic wave device according to claim 1, wherein the first resonator and the second resonator are stacked.

7. A bulk acoustic wave device, comprising:
   a stacked arrangement of a first BAW resonator and a second BAW resonator, the first and second BAW resonators each comprising a first electrode, a piezoelectric layer disposed at least partially over the first electrode, and a second electrode disposed over at least partially on the piezoelectric layer; and
   a coupling layer between the first BAW resonator and the second BAW resonator, the coupling layer comprising a plurality of layers of alternating high and low acoustic impedances for acoustically coupling the first and second BAW resonators,
   wherein the first electrode of the first BAW resonator and the second electrode of the second BAW resonator are connected, wherein the second electrode of the first BAW resonator and the first electrode of the second BAW resonator are connected, and wherein the piezoelectric layer of the first BAW resonator and the piezoelectric layer of the second BAW resonator are oriented in a same direction or are oriented in opposite directions.

8. The bulk acoustic wave device according to claim 7, further comprising a substrate comprising an acoustic mirror or a membrane region on which the first BAW resonator and the second BAW resonator are formed, the acoustic mirror comprising a plurality of layers of alternating high and low acoustic impedances.

9. A bulk acoustic wave device, comprising:
a stacked arrangement of a first BAW resonator and a second BAW resonator, the first and second BAW resonators each comprising a first electrode, a piezoelectric layer disposed over at least a portion of the first electrode, and a second electrode disposed over at least a portion of the piezoelectric layer; and
a coupling layer between the first BAW resonator and the second BAW resonator, the coupling layer comprising a plurality of layers of alternating high and low acoustic impedances for acoustically coupling the first and second BAW resonators,
wherein the first electrode of the first BAW resonator and the first electrode of the second BAW resonator are connected,
wherein the second electrode of the first BAW resonator and the second electrode of the second BAW resonator are connected, and
wherein the piezoelectric layer of the first BAW resonator and the piezoelectric layer of the second BAW resonator are oriented in a same direction or are oriented in opposite directions.

10. The bulk acoustic wave device according to claim 9, further comprising a substrate comprising an acoustic mirror or a membrane region on which the first BAW resonator and the second BAW resonator are formed, the acoustic mirror comprising a plurality of layers of alternating high and low acoustic impedances.

11. A filter, comprising:
a first stage; and
a second stage,
wherein at least one of the first stage and the second stage comprises a bulk acoustic wave device, the bulk acoustic wave device comprising:
a first resonator and a second resonator, each of the first and second resonators comprising: a first electrode; a piezoelectric layer disposed over at least a portion of the first electrode; and a second electrode disposed over at least a portion of the piezoelectric layer,
wherein the first and second resonators are acoustically coupled, and the first and second resonators are electrically connected in parallel; and
a coupling layer disposed between the first resonator and the second resonator, the coupling layer comprising a plurality of layers of alternating high and low acoustic impedances for acoustically coupling the first and second BAW resonators, wherein the first electrode of the first resonator and the second electrode of the second resonator are connected, and the second electrode of the first resonator and the first electrode of the second resonator are connected.

12. The filter of claim 11, wherein the piezoelectric layer of the first resonator and the piezoelectric layer of the second resonator are oriented in a same direction or are oriented in opposite directions.

13. The filter according to claim 11, wherein the first resonator and the second resonator comprise substantially same properties.

14. The filter according to claim 11, further comprising a substrate supporting the first stage and the second stage, wherein the substrate comprises an acoustic mirror or a membrane region on which the first resonator and the second resonator are formed, the acoustic mirror comprising a plurality of layers of alternating high and low acoustic impedances.

15. The filter according to claim 11, wherein the first resonator and the second resonator are stacked.

16. The filter according to claim 11, further comprising a coupling layer between the first resonator and the second resonator, wherein the coupling layer comprises one or more layers of alternating high and low acoustic impedances for acoustically coupling the first and second resonators.

17. The filter of claim 11, wherein the first stage comprises a coupled resonator filter, and wherein the second stage comprises a bulk acoustic wave device, the bulk acoustic wave device comprising:
a first resonator; and
a second resonator,
wherein the first and second resonators are acoustically coupled, and
wherein the first and second resonators are electrically connected in parallel.

18. The filter of claim 11, wherein the second stage comprises a series stage comprising the bulk acoustic wave device and a shunt stage comprising a further bulk acoustic wave device, the further bulk acoustic wave device comprising:
a first resonator; and
a second resonator,
wherein the first and second resonators are acoustically coupled, and
wherein the first and second resonators are electrically connected in parallel.

19. The filter of claim 18, wherein the first stage comprises a coupled resonator filter.

20. The filter of claim 19, wherein the coupled resonator filter comprises a first resonator and a second resonator, wherein the first and second resonators are acoustically coupled.

21. The filter of claim 20, comprising:
a first port and a second port,
wherein a first electrode of the first resonator of the coupled resonator filter is connected to a first terminal of the first port, and a second electrode of the first resonator of the coupled resonator filter is connected to a second terminal of the first port,
wherein a first electrode of the second resonator of the coupled resonator filter is connected to a second electrode of the first resonator and to a first electrode of the second resonator of the further bulk acoustic wave device, and a second electrode of the second resonator of the coupled resonator filter is connected to a first electrode of the first resonator and to a second electrode of the second resonator of the further bulk acoustic wave device,
wherein the first electrode of the first resonator of the further bulk acoustic wave device is connected to a first electrode of the first resonator of the bulk acoustic wave device, and the second electrode of the second resonator of the further bulk acoustic wave device is connected to a second electrode of the second resonator of the bulk acoustic wave device, wherein the second electrode of the first resonator and the first electrode of the second resonator of the bulk acoustic wave device are connected to a first terminal of the second port, and wherein the second electrode of the first resonator and the first electrode of the second resonator of the further bulk acoustic wave device are connected to a second terminal of the second port.

22. A filter, comprising:

a series connection of a coupled resonator filter and a bulk acoustic wave device; and a shunt stage comprising a further bulk acoustic wave device, the shunt stage being coupled to the series connection, wherein the coupled resonator filter comprises a first resonator, a second resonator and a coupling layer disposed between the first and second resonators, the coupling layer comprising a plurality of layers of alternating high and low acoustic impedances for acoustically coupling the first and second BAW resonators, wherein the first and second resonators are coupled, and wherein each of the bulk acoustic wave device and the further bulk acoustic wave device comprises:

a first resonator; and a second resonator, wherein the first and second resonators of the further bulk acoustic wave device are coupled, and wherein the first and second resonators of the further bulk acoustic wave device are electrically connected in parallel.

23. The filter of claim 22, comprising:

a first port and a second port, wherein a first electrode of the first resonator of the coupled resonator filter is connected to a first terminal of the first port, and a second electrode of the first resonator of the coupled resonator filter is connected to a second terminal of the first port, wherein a first electrode of the second resonator of the coupled resonator filter is connected to a second electrode of the first resonator and to a first electrode of the second resonator of the further bulk acoustic wave device, and a second electrode of the second resonator of the coupled resonator filter is connected to a first electrode of the first resonator and to a second electrode of the second resonator of the further bulk acoustic wave device, wherein the first electrode of the first resonator of the further bulk acoustic wave device is connected to a first electrode of the first resonator of the bulk acoustic wave device, and the second electrode of the second resonator of the further bulk acoustic wave device is connected to a second electrode of the second resonator of the bulk acoustic wave device, wherein the second electrode of the first resonator and the first electrode of the second resonator of the bulk acoustic wave device are connected to a first terminal of the second port, and wherein the second electrode of the first resonator and the first electrode of the second resonator of the further bulk acoustic wave device are connected to a second terminal of the second port.

24. A bulk acoustic wave device, comprising:

a first resonator and a second resonator, each of the first and second resonators comprising: a first electrode; a piezoelectric layer disposed over at least a portion of the first electrode; and a second electrode disposed over at least a portion of the piezoelectric layer, wherein the first and second resonators are acoustically coupled, the first and second resonators are electrically connected in parallel; and a coupling layer disposed between the first resonator and the second resonator, wherein the first electrode of the first resonator and the first electrode of the second resonator are connected, and the second electrode of the first resonator and the second electrode of the second resonator are connected.

25. A filter, comprising:

a first stage; and a second stage, wherein at least one of the first stage and the second stage comprises a bulk acoustic wave device, the bulk acoustic wave device comprising:

a first resonator and a second resonator, each of the first and second resonators comprising: a first electrode; a piezoelectric layer disposed over at least a portion of the first electrode; and a second electrode disposed over at least a portion of the piezoelectric layer, wherein the first and second resonators are acoustically coupled, and the first and second resonators are electrically connected in parallel; and a coupling layer disposed between the first resonator and the second resonator, wherein the first electrode of the first resonator and the first electrode of the second resonator are connected, and the second electrode of the first resonator and the second electrode of the second resonator are connected.

* * * * *